(12) United States Patent
Prather et al.

(10) Patent No.: US 9,575,524 B1
(45) Date of Patent: Feb. 21, 2017

(54) ELECTRONIC DEVICES WITH VENTILATION SYSTEMS

(71) Applicant: Apple Inc., Cupertino, CA (US)

(72) Inventors: Eric R. Prather, San Jose, CA (US); Christiaan A. Ligtenberg, San Carlos, CA (US); Jay S. Nigen, Mountain View, CA (US); Laura M. Campo, Santa Clara, CA (US); Nicholas D. Mancini, San Jose, CA (US); Brett W. Degner, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/834,217

(22) Filed: Aug. 24, 2015

(51) Int. Cl.
*G06F 1/20* (2006.01)
*G06F 1/16* (2006.01)
*H05K 7/20* (2006.01)

(52) U.S. Cl.
CPC ............ *G06F 1/203* (2013.01); *G06F 1/1616* (2013.01); *G06F 1/1637* (2013.01); *G06F 1/1662* (2013.01); *G06F 1/1681* (2013.01); *H05K 7/20145* (2013.01)

(58) Field of Classification Search
CPC ...................................................... G06F 1/203
See application file for complete search history.

(56) References Cited

U.S. PATENT DOCUMENTS

| 6,353,536 | B1 | 3/2002 | Nakamura et al. | |
|---|---|---|---|---|
| 6,522,539 | B2 | 2/2003 | Ota et al. | |
| 8,347,952 | B2 * | 1/2013 | Ali | G06F 1/203 165/122 |
| 8,926,414 | B1 | 1/2015 | Kirkpatrick | |
| 8,964,383 | B2 * | 2/2015 | Degner | G06F 1/203 165/104.33 |
| 2008/0128119 | A1 * | 6/2008 | Ali | G06F 1/203 165/104.33 |
| 2010/0088853 | A1 | 4/2010 | Degner et al. | |
| 2011/0114294 | A1 * | 5/2011 | Degner | H01L 23/4006 165/104.26 |
| 2013/0003280 | A1 * | 1/2013 | Degner | G06F 1/1616 361/679.09 |
| 2013/0163200 | A1 | 6/2013 | Takahashi | |
| 2013/0321216 | A1 | 12/2013 | Jervis et al. | |
| 2013/0327507 | A1 * | 12/2013 | Degner | G06F 1/203 165/120 |

(Continued)

*Primary Examiner* — Adrian S Wilson
(74) *Attorney, Agent, or Firm* — Treyz Law Group, P.C.; Joseph F. Guihan

(57) ABSTRACT

An electronic device such as a portable computer may be provided with a lower housing and an upper housing. The electronic device may include hinge structures which allow the upper housing to rotate about a rotational axis relative to the lower housing. The electronic device may include a ventilation port structure with intake openings that allow air to be drawn into the electronic device. The ventilation structure may also include exhaust openings that are used to expel air from the lower housing. When the electronic device is in an open position, it may be desirable for the ventilation structure to form more exhaust openings than when the electronic device is in a closed position. The ventilation structure may form lower exhaust openings when the electronic device is in the closed position and form upper and lower exhaust openings when the electronic device is in the open position.

20 Claims, 15 Drawing Sheets

(56) References Cited

U.S. PATENT DOCUMENTS

| | | | |
|---|---|---|---|
| 2013/0329357 A1* | 12/2013 | Degner | H05K 5/02 361/679.47 |
| 2013/0329368 A1* | 12/2013 | Degner | G06F 1/20 361/707 |
| 2014/0049522 A1* | 2/2014 | Mathew | H05B 33/0896 345/204 |
| 2014/0160659 A1 | 6/2014 | Massaro et al. | |
| 2015/0169014 A1 | 6/2015 | Rivera et al. | |

* cited by examiner

ELECTRONIC DEVICES WITH VENTILATION SYSTEMS

BACKGROUND

This relates to electronic devices, and more particularly, electronic devices with ventilation systems.

Electronic devices such as portable computers often generate heat during operation. Internal components in a portable computer may generate heat. Heat generated by the portable computer may adversely affect the portable computer's performance, as some internal components may only function properly below a certain temperature. Additionally, heat generation may detract from a user's experience. For example, if the exterior surfaces of a portable computer are too hot, the user may experience discomfort during use.

In order to control temperature, portable computers may use a ventilation system. In a typical arrangement, a portable computer may include an input vent and an exhaust vent. A fan may be used to draw air through the input vent. The fan may blow air past a high temperature internal component and out the exhaust vent. In this way, the fan expels heat from the portable computer and controls the temperature of the device.

For certain electronic devices, it may be difficult to cool the device while maintaining the desired device aesthetic. For example, it may not be satisfactory for ventilation structures to be visible during operation of the device.

It would therefore be desirable to be able to provide improved ventilation structures for electronic devices.

SUMMARY

An electronic device such as a portable computer may be provided with a lower housing and an upper housing. The lower housing may include components such as a keyboard or a touchpad. The upper housing may include a display. The electronic device may include hinge structures which allow the upper housing to rotate about a rotational axis relative to the lower housing. When the electronic device is in a closed position, the upper housing may be substantially parallel to the lower housing. When the electronic device is in an open position, the upper housing may be positioned at an angle between 90° and 135° relative to the lower housing.

An electronic device may include a ventilation port structure to assist in controlling the temperature of the device. A fan in the electronic device may blow air past a heat generating component and through the ventilation port structure to expel hot air from the device. The ventilation port structure may have intake openings that allow air to be drawn into the electronic device. The fan may draw air from the front of the upper housing such that the air passes through an upper gap between the hinge structures and an upper portion of the lower housing and proceeds into the lower housing.

The ventilation port structure may also include exhaust openings. The exhaust openings may be used to expel air from the lower housing of the electronic device. To ensure that hot exhaust air is not recirculated into the device, the exhaust openings may be separated from the intake openings. The exhaust openings may be formed in a lower portion of the ventilation structure such that exhaust air passes through a lower gap between the hinge structures and a lower portion of the lower housing. To further separate the exhaust openings and the intake openings, the intake openings may be formed in a central portion of the ventilation structure and the exhaust openings may be formed on either side of the intake openings.

When the electronic device is in the open position, it may be desirable for the ventilation structure to form additional exhaust openings. The ventilation structure may form the lower exhaust openings when the electronic device is in the closed position and form upper and lower exhaust openings when the electronic device is in the open position. The ventilation structure may be an elongated plastic structure with an upper portion, a lower portion, and a central portion. The lower portion and central portion may form lower exhaust openings that expel air out of the lower housing in both the open and closed positions. The lower portion and upper portion may form upper exhaust openings that are blocked by the upper and lower housing in the closed position. In the open position, the upper exhaust openings may not be blocked and may be used to exhaust hot air.

Further features of the invention, its nature and various advantages will be more apparent from the accompanying drawings and the following detailed description of the preferred embodiments.

DETAILED DESCRIPTION

Electronic devices may include ventilation systems. The ventilation system may be used to expel heat from the electronic device to control the temperature of the electronic device. An illustrative electronic device that may be provided with a ventilation system is shown in FIG. 1.

Figure 1:
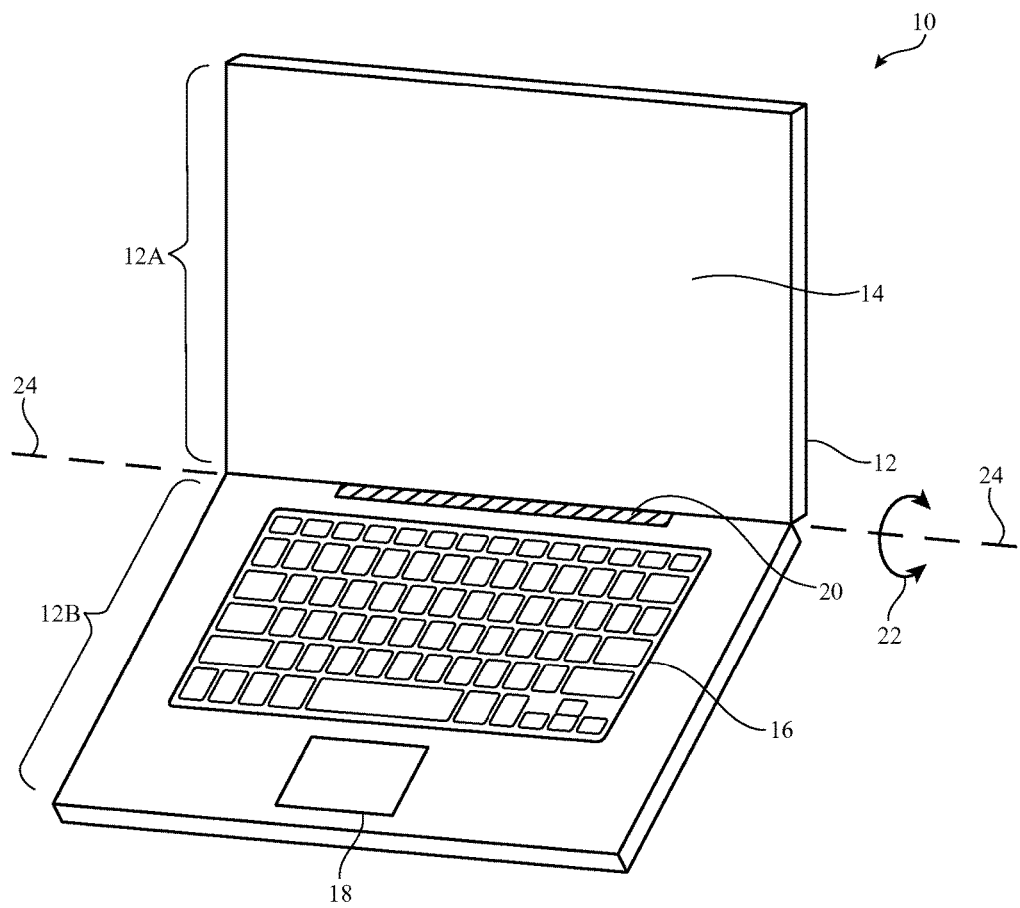
FIG. 1 is a perspective view of an illustrative electronic device such as a laptop computer with a ventilation system in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes be referred to as a display housing or lid, is placed in a closed position by rotating upper housing 12A towards lower housing 12B, which may sometimes be referred to as a base, about rotational axis 24.

Upper housing 12A and lower housing 12B may be formed of plastic, glass, ceramics, fiber composites, metal (e.g., stainless steel, aluminum, etc.), other suitable materials, or a combination of any two or more of these materials. Display 14 may be protected using a display cover layer such as a layer of transparent glass or clear plastic.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may be a liquid crystal display, an organic light-emitting diode display, a plasma display, an electrophoretic display, an electrowetting display, a display using other types of display technology, or a display that includes display structures formed using more than one of these display technologies.

The illustrative configuration for device 10 that is shown in FIG. 1 is merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Figure 2:
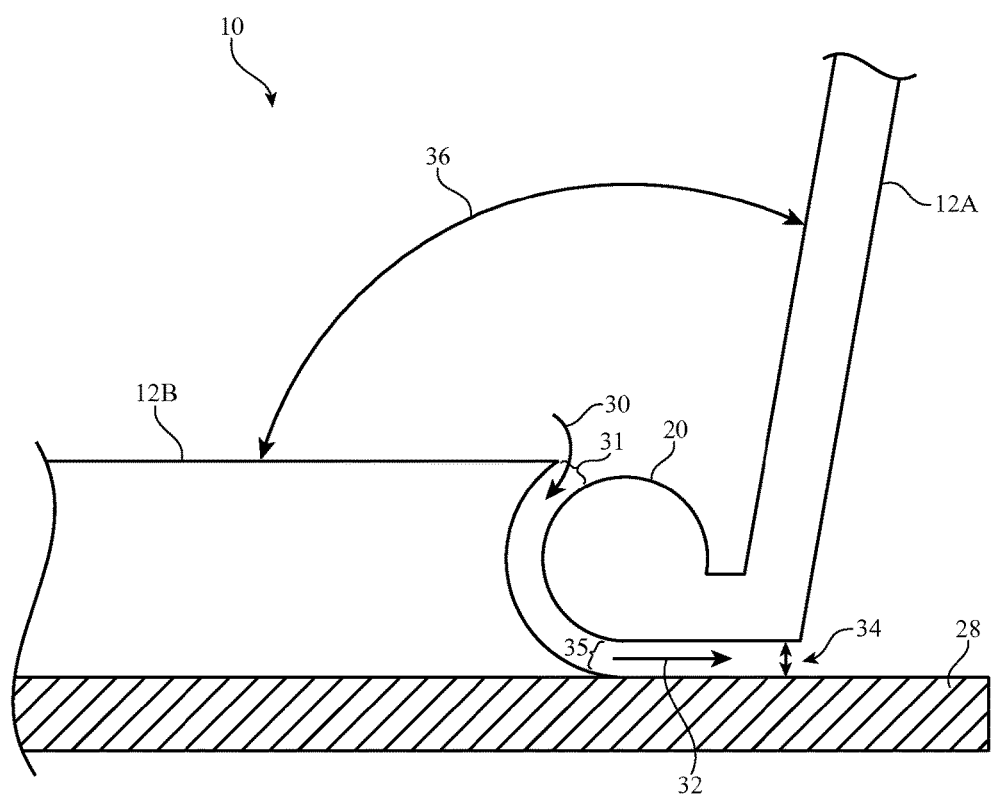
FIG. 2 is a cross-sectional side view of an illustrative electronic device such as a laptop computer with a ventilation system that draws air into and exhausts air from a lower housing in accordance with an embodiment.

FIG. 2 shows a cross-sectional side view of the illustrative device shown in FIG. 1. Portable computer 10 may be located on a surface such as surface 28 (e.g., a table, desk, etc.). Hinge structures 20 may be used to allow portions of the electronic device to rotate relative to each other. The hinge structures may, for example, be used to allow upper housing 12A (sometimes referred to as a lid) to rotate relative to lower housing 12B (sometimes referred to as a base). Hinge structures 20 may extend along the entire length of lid 12A or may be included in only a portion of lid 12A.

In order to manage the temperature of portable computer 10, a ventilation system may be included. As shown, air may enter lower housing 12B in direction 30. The air may be drawn into the lower housing by a fan. The fan may blow air past a heat generating component and out of lower housing 12B in direction 32. The air may pass underneath upper housing 12A when being expelled from lower housing 12B. This configuration helps ensure that the intake and exhaust of the ventilation system are spatially separated. If the intake and exhaust are not spatially separated, the hot exhaust air may be immediately recirculated into the electronic device by the intake. This may adversely affect the performance of the ventilation system.

In FIG. 2, intake air enters lower housing 12B through the top of lower housing 12B (e.g., through upper gap 31 between the top of lower housing 12B and the front of upper housing 12A that runs parallel to rotational axis 24) while exhaust air exits lower housing 12B through the bottom of lower housing 12B (e.g., through lower gap 35 between the bottom of lower housing 12B and the rear of upper housing 12A that runs parallel to rotational axis 24). This example is merely illustrative. If desired, intake air may enter lower housing 12B through the bottom of lower housing 12B and exhaust air may exit lower housing 12B through the top of lower housing 12B. Alternatively or in combination, intake air may enter lower housing 12B through both the top and bottom of lower housing 12B. Similarly, exhaust air may exit lower housing 12B through both the top and bottom of lower housing 12B.

The exhaust air in FIG. 2 may exit lower housing 12B through lower gap 35 and pass through gap 34. Gap 34 may be formed between upper housing 12A and surface 28. Hinge structures 20 enable upper housing 12A to rotate relative to lower housing 12B. When portable computer 10 is not in use, upper housing 12A may be closed and angle 36 may be 0° (e.g., lower housing 12B and upper housing 12A may be parallel). When portable computer 10 is in use, upper housing 12A may be separated from lower housing 12B by angle 36. Angle 36 (sometimes referred to as a lid angle) may typically have a value between 90° and 135° during use, although other angles may be used if desired.

Figure 3:
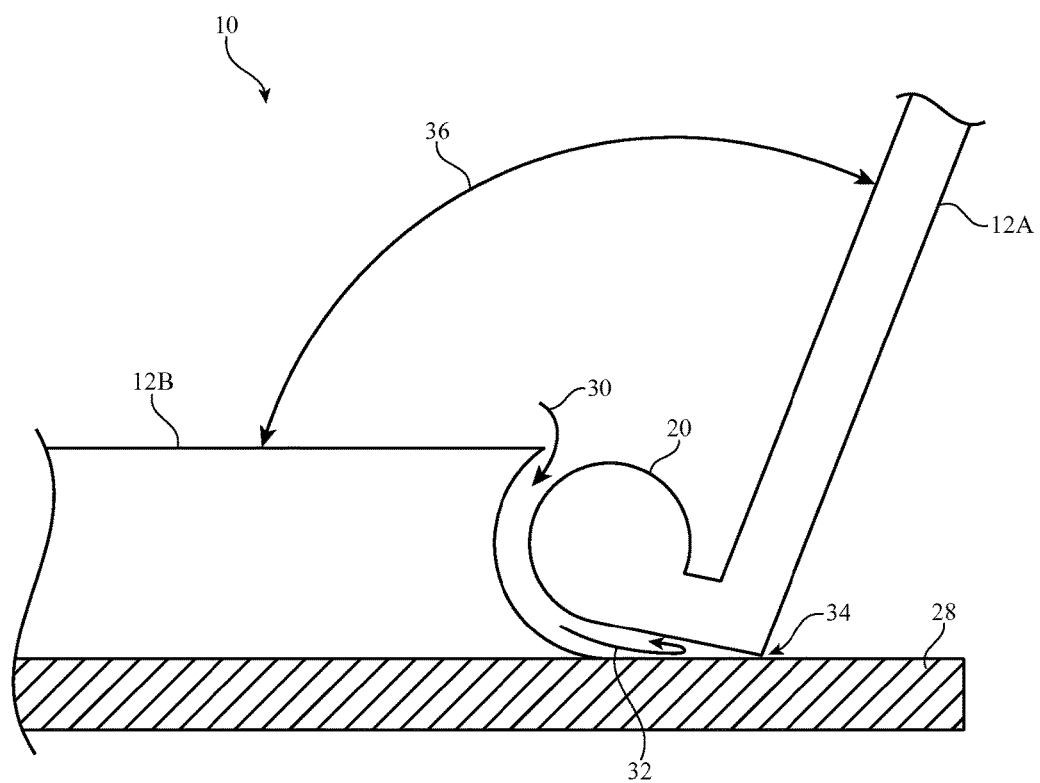
FIG. 3 is a cross-sectional side view of the illustrative electronic device of FIG. 2 when the upper housing is opened at a wide angle in accordance with an embodiment.

The size of gap 34 may vary depending on the size of angle 36. As angle 36 gets larger, gap 34 may become smaller. This may allow less exhaust air to exit the portable computer. In FIG. 2 angle 36 may be equal to, for example, 100°. At this angle of separation, gap 34 is sufficiently large for air to exit lower housing 12B via path 32. In FIG. 3, angle 36 may be equal to, for example, 135°. At this angle of separation, upper housing 12A may be very close to surface 28. Portions of housing 12A may be in direct contact with surface 28. Consequently, gap 34 may be very small. The small size of gap 34 may prevent exhaust air from being expelled behind upper housing 12A. The exhaust air may instead follow path 32 and remain adjacent to the portable computer. This may prevent the ventilation system from adequately cooling electronic device 10.

Figure 4:
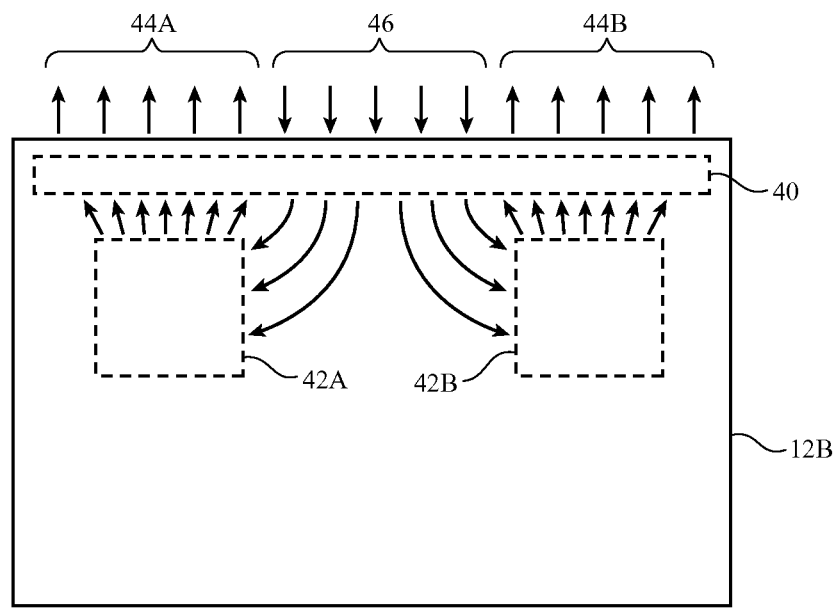
FIG. 4 is a top view of an illustrative lower housing of an electronic device with a ventilation system with multiple fans in accordance with an embodiment.

FIG. 4 is a top view of an illustrative portable computer lower housing with a ventilation structure. Ventilation structure 40 may be a structure positioned on an edge of lower housing 12B. The ventilation structure may be an elongated plastic structure with a longitudinal axis that is parallel to rotational axis 24. Ventilation structure 40 may form ventilation openings or ports for electronic device 10. Ventilation structure 40 may sometimes be referred to as a ventilation port structure or a ventilation housing structure. Ventilation structure 40 may be made from a dielectric material or other materials such as metal if desired.

Figure 5:
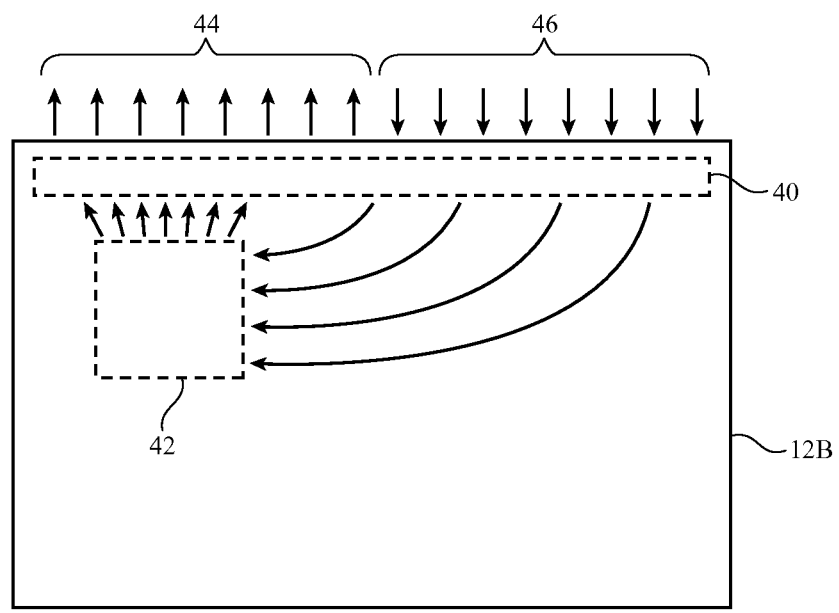
FIG. 5 is a top view of an illustrative lower housing of an electronic device with a ventilation system with a single fan in accordance with an embodiment.

Ventilation structure 40 may be formed at an edge of lower housing 12B adjacent to hinge structures 20. In FIGS. 4 and 5, ventilation structure 40 is shown as extending across lower housing 12B. This example is merely illustrative. Ventilation structure 40 may have any desired length. Ventilation structure 40 may extend from a sidewall on one side of the lower housing to a sidewall on the other side of the housing. Attachment mechanisms such as adhesive or screws may be used to attach ventilation structure 40 to the sidewall of the lower housing 12B. This example is merely illustrative and attachment mechanisms may be used to attach ventilation structure 40 to other structures such as the top or bottom of lower housing 12B or an internal structure within lower housing 12B. Ventilation structure 40 may extend across only a portion of lower housing 12B. For example, ventilation structure 40 may overlap with hinge structures 20 in FIG. 1. There may be additional components that separate ventilation structure 40 from the sidewalls of lower housing 12B.

In order to spatially separate the intake and exhaust of the ventilation system and prevent hot exhaust air from being recirculated into the lower housing, different portions of the ventilation structure may be used for intake and exhaust. As shown in FIG. 4, lower housing 12B may include one or more fans 42. In FIG. 4, there is one fan on each side of ventilation structure 40. Fan 42A may expel air through portion 44A of ventilation structure 40 while fan 42B may expel air through portion 44B of ventilation structure 40. In between the two exhaust areas 44 may be an intake area 46. Ventilation structure 40 may have ventilation ports that allow intake air to enter lower housing 12B at portion 46.

The intake air may enter lower housing 12B through the top of lower housing 12B in the central portion of ventilation structure 40 (e.g., portion 46) while exhaust air may exit lower housing 12B through the bottom of lower housing 12B at the ends of ventilation structure 40 (e.g., portions 44A and 44B). This arrangement ensures spatial separation of the hot exhaust air and the cool intake air.

The example of lower housing 12B including one fan on each end of ventilation structure 40 with an intake area in between is merely illustrative. As shown in FIG. 5, the lower housing may instead include only one fan 42. Approximately half of ventilation structure 40 (e.g., portion 46) may be used to draw air into lower housing 12B. Fan 42 may expel exhaust air through an additional portion 44 of ventilation structure 40.

In general, lower housing 12B may include any desired number of fans (e.g., one, two, three, four, more than four, etc.) in any desired locations. Each fan may be associated with a unique exhaust area of ventilation structure 40. In certain embodiments, multiple fans may be used to blow air through a single exhaust area.

In order to accommodate both intake areas and exhaust areas, ventilation structure 40 may have a different structure at different portions of the ventilation structure. For example, at intake areas (e.g., portion 46), ventilation structure may have an intake port at a top portion of the structure. This will allow the intake air to enter lower housing 12B through the top of the lower housing from in front of the upper housing. There may be no openings at the bottom of ventilation structure 40 in the intake areas to prevent intake of hot exhaust air. Alternatively, at exhaust areas ventilation structure 40 may have an exhaust port at a bottom portion of the structure. This will allow the exhaust air to exit lower housing 12B through the bottom of the lower housing behind the upper housing.

Figure 6:
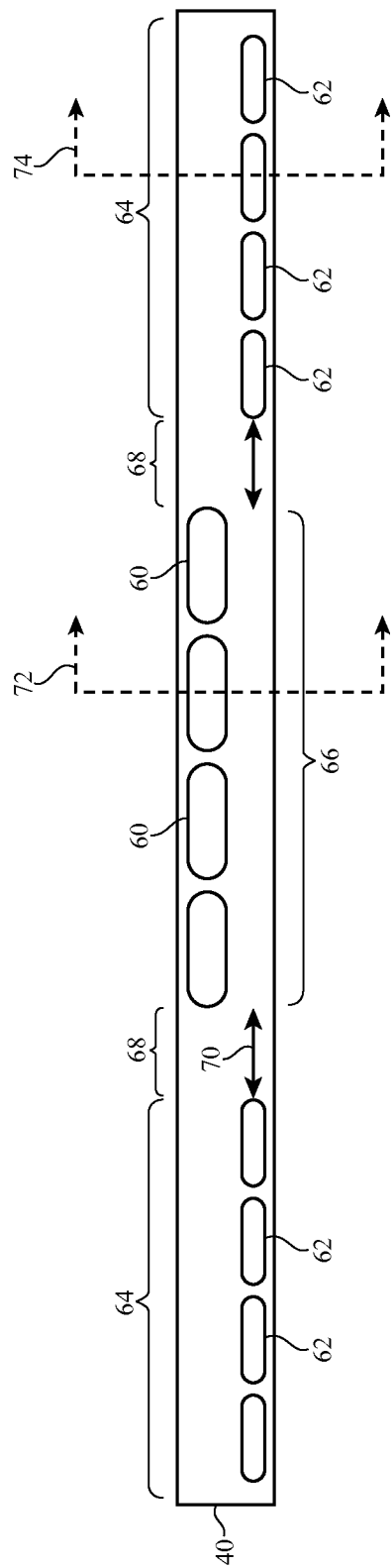
FIG. 6 is a side view of an illustrative ventilation structure with intake openings and exhaust openings in accordance with an embodiment.

FIG. 6 shows a side view of an illustrative ventilation structure that may be included in the lower housing of a portable computer. As shown, exhaust slots 62 may be formed on the sides 64 of ventilation structure 40. Intake slots 60 may be formed in central portion 66 of ventilation structure 40. The intake openings and the exhaust openings may be separated by portions of ventilation structures without openings (e.g., portions 68). These portions may be included to ensure that the heated exhaust air is not recirculated into lower housing 12B through intake openings 62. Portions 68 may have a width 70 that defines the distance between the intake openings and the exhaust openings. Width 70 may be any desired distance. For example, the intake openings and exhaust openings may be separated by one or more millimeters, one or more centimeters, three or more centimeters, or any other desired distance.

FIG. 6 also shows how intake openings 60 may be positioned on an upper portion of ventilation structure 40. This ensures that the air that enters lower housing 12B through intake openings 60 comes through the upper gap from above the lower housing. Exhaust openings 62 may be positioned on a lower portion of ventilation structure 40. This ensures that the air that exits the lower housing 12B travels through the exhaust openings and through the lower gap to behind the lower and upper housings of device 10.

Intake openings 60 and exhaust openings 62 may have any desired shape or size. For example, the openings may be rectangular, square, circular, or elliptical. The openings may have rounded corners or sharply angled corners. Other shapes may be used if desired. The openings may have a uniform size or varying size. For example, intake openings 60 may all be the same size. Exhaust openings 62 may all be the same size. Exhaust openings 62 may be smaller or larger than intake openings 60. The size of the openings may also vary. For example, each opening may be a different size. Certain openings may be one size while other openings may be a different size. The sizes of the openings may be designed for the specific application of the accompanying electronic device.

Figure 7:
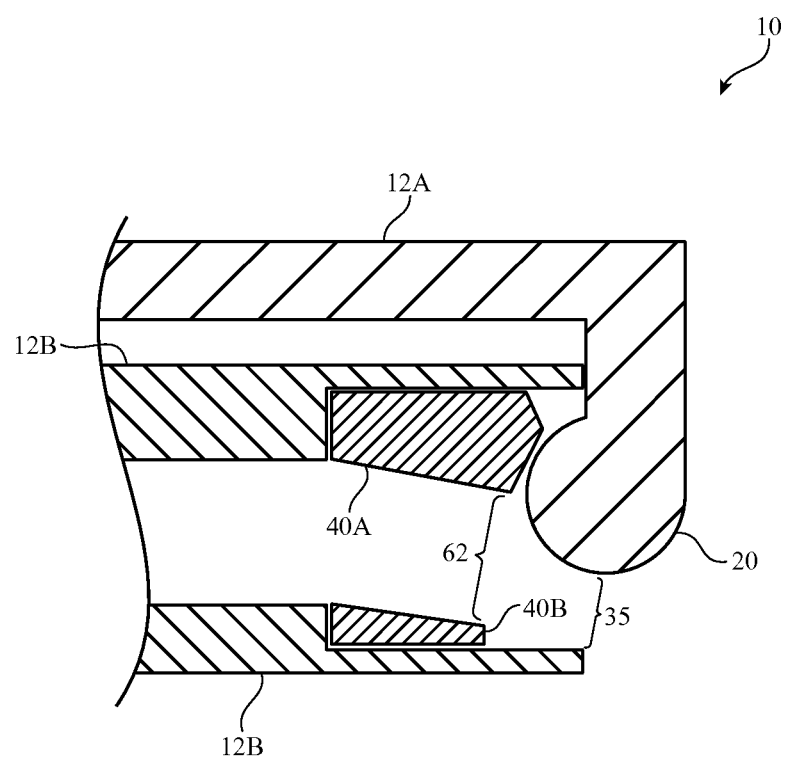
FIG. 7 is a cross-sectional side view of an illustrative exhaust portion of the ventilation structure of FIG. 6 in a closed laptop computer in accordance with an embodiment.

Some or all of ventilation structure 40 may be formed as an integral part of lower housing 12B. For example, lower housing 12B may be a unitary piece of metal or plastic that is machined to include a ventilation portion 40. Consequently, ventilation structure 40 may sometimes be referred to as a ventilation housing portion FIG. 7 is a cross-sectional side view of an illustrative ventilation structure taken along line 74 of FIG. 6. As shown, ventilation structure 40 may be positioned in between top and bottom portions of lower housing 12B. Ventilation structure 40 may be attached to lower housing 12B with a screw, adhesive, or other desired fasteners. For example, ventilation structure 40 may have openings that receive a screw. The screw may pass through the ventilation structure's opening and into a corresponding threaded opening in lower housing 12B. The ventilation structure may have a threaded opening. A screw may pass through an opening in lower housing 12B and into the ventilation structure's threaded opening to secure the ventilation structure to the lower housing. The ventilation structure's opening may be on a top surface, a side surface, or a bottom surface of ventilation structure 40.

Adhesive may also be used to attach ventilation structure 40 to lower housing 12B. Adhesive may be applied to a top surface of the ventilation structure, a bottom surface of the ventilation structure, a side surface of the ventilation structure, or multiple surfaces of the ventilation structure. Adhesive may also be applied to lower housing 12B at the locations where ventilation structure 40 will be adhered. Any desired type of adhesive may be used (e.g., pressure sensitive adhesive, liquid curable adhesive, moisture curable adhesive, light curable adhesive, thermally curable adhesive, etc.).

Protrusions and corresponding recesses may be used to attach ventilation structure 40 to lower housing 12B. For example, ventilation structure 40 may include a number of protrusions that protrude into corresponding recesses in lower housing 12B to secure ventilation structure 40 to lower housing 12B. Alternatively or in combination, lower housing 12B may include a number of protrusions that protrude into corresponding recesses in ventilation structure 40. The ventilation structure may include any desired number of protrusions and recesses for attaching the ventilation structure to lower housing 12B.

Figure 8:
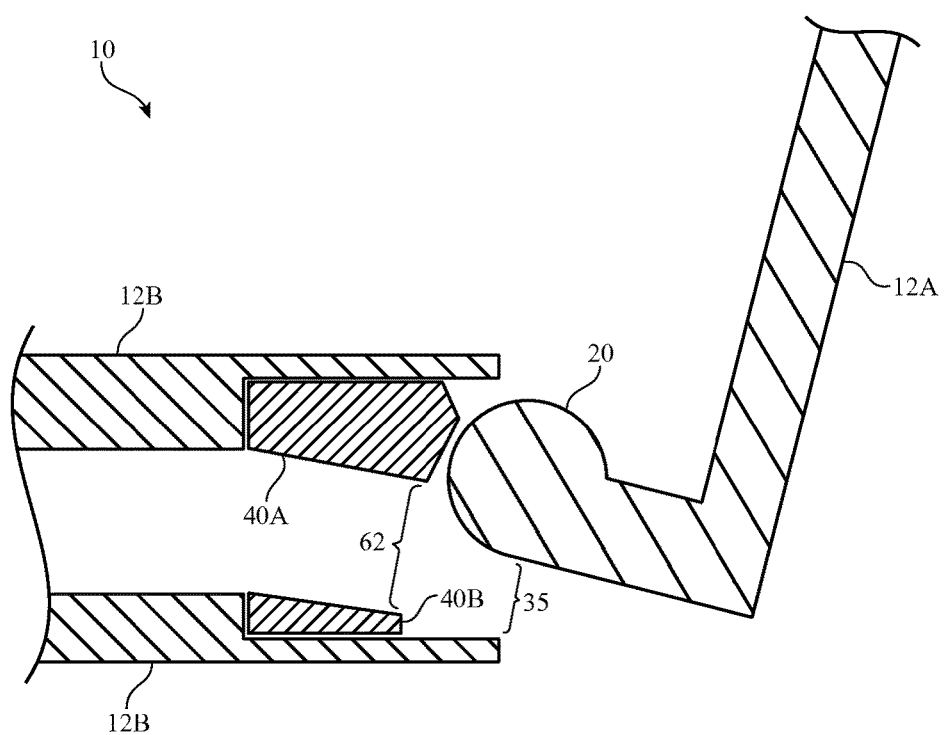
FIG. 8 is a cross-sectional side view of an illustrative exhaust portion of the ventilation structure of FIG. 6 in an open laptop computer in accordance with an embodiment.

Ventilation structure 40 may have portions that form exhaust openings 62 as shown in FIG. 7. Ventilation structure may have a top portion 40A and a bottom portion 40B that combine to form a channel for guiding exhaust air out of the lower housing of the electronic device. When upper housing 12A is closed relative to lower housing 12B, as shown in FIG. 7, exhaust opening 62 may be sufficiently large to allow exhaust air escape. FIG. 8 shows the illustrative ventilation structure of FIG. 7 when upper housing 12A is open relative to lower housing 12B. In this position, as discussed in connection with FIG. 3, exhaust air may not be able to exit the ventilation area due to the small gap created when a portion upper housing 12A is adjacent to the resting surface of the electronic device.

Ventilation structure 40 may be manufactured using any desired method (e.g., injection molding, 3D printing, etching etc.). Ventilation structure 40 may be formed as a solid piece of material such as plastic. Alternatively, ventilation structure 40 may have one or more hollow portions. For example, top portion 40A of ventilation structure 40 may be hollow. Hollow portions of the ventilation structure may be used to accommodate additional electronic components or cables.

Figure 9:
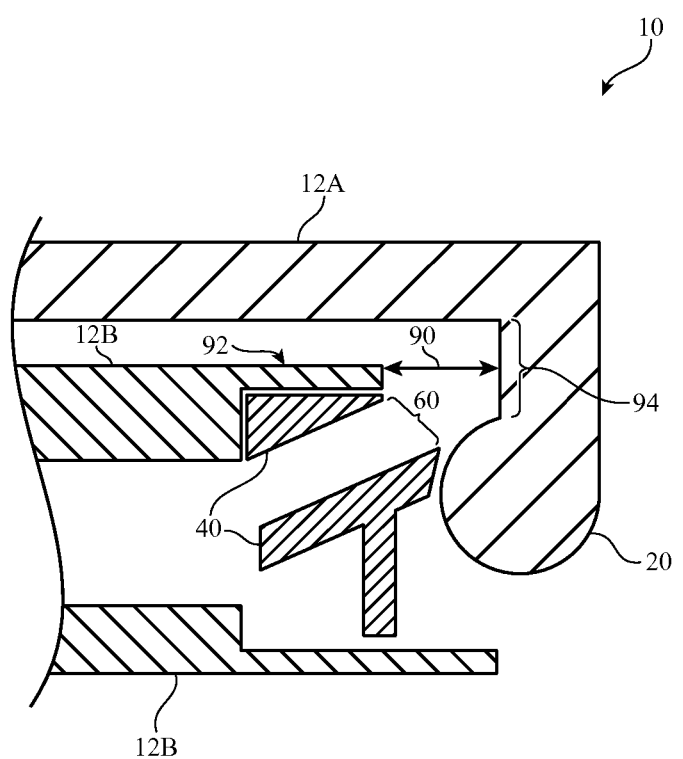
FIG. 9 is a cross-sectional side view of an illustrative intake portion of the ventilation structure of FIG. 6 in a closed laptop computer in accordance with an embodiment.
Figure 10:
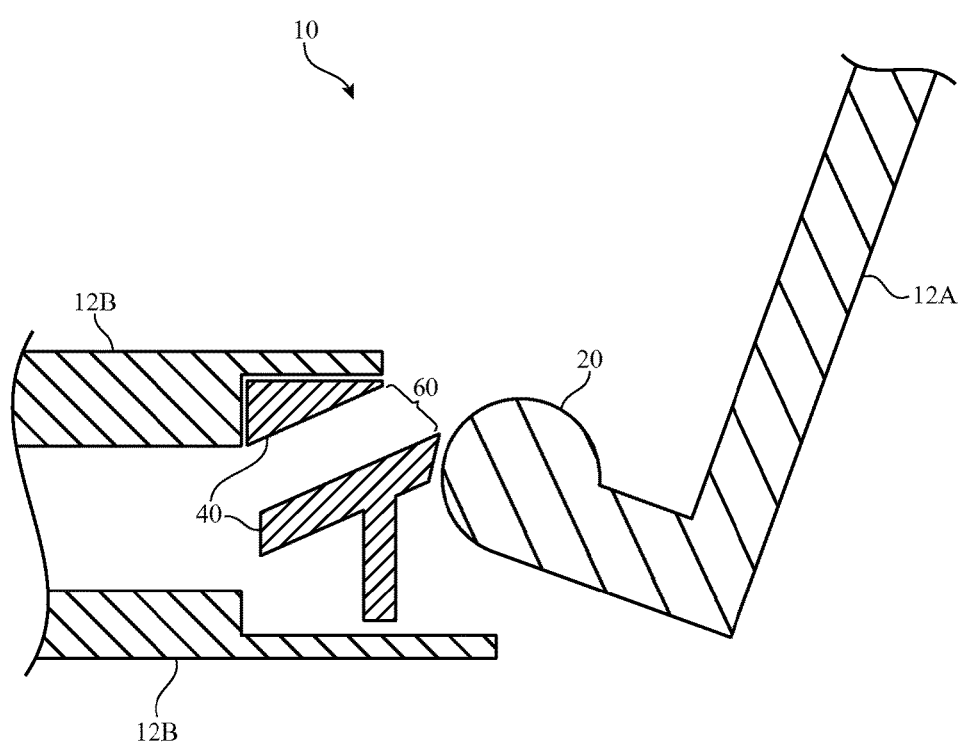
FIG. 10 is a cross-sectional side view of an illustrative intake portion of the ventilation structure of FIG. 6 in an open laptop computer in accordance with an embodiment.

FIGS. 9 and 10 are cross-sectional side views of an illustrative ventilation structure taken along line 72 of FIG. 6. As shown, portions of the ventilation structure may be used to form intake openings 60. Ventilation structure 40 may have a top portion and a bottom portion that combine to form a channel for guiding intake air into the lower housing of the electronic device. Ventilation structure 40 may be designed such that the airflow into intake openings 60 is comparable when the portable computer is in both closed (e.g., FIG. 9) and open (e.g., FIG. 10) positions.

If desired, lower housing 12B or upper housing 12A may vary along the length of ventilation structure 40. For example, the central portion of lower housing 12B (e.g., the portion adjacent to central portion 66 of ventilation structure 40) may be different than the edge portions of lower housing 12B (e.g., the portions adjacent to sides 64 of ventilation structure 40). The central portion of lower housing 12B may be separated from upper housing 12A by a gap 90 when the portable computer is in a closed position. The edge portions of lower housing 12B may not be separated from upper housing 12A by this gap. As shown in FIG. 7, the edge portions of lower housing 12B may be separated from upper housing 12A by little to no gap. Gap 90 may be produced by having top portion 92 of lower housing 12B extend a shorter distance in the central portions of the lower housing than the edge portions of the lower housing. Additionally, the central portion of upper housing 12A may have a recess in area 94 to ensure gap 90 is of sufficient width.

As shown in FIG. 6, ventilation structure 40 may have exhaust openings in only a bottom portion of the structure. However, as discussed in connection with FIGS. 3 and 8 above, this may be problematic when upper housing 12A is at a large angle relative to lower housing 12B. At high angles, the exhaust air may not be able to exit the lower housing between the upper housing and the resting surface of the device, reducing the effectiveness of the ventilation system. To ensure adequate ventilation at all lid angles, ventilation structure 40 may be provided with both upper and lower exhaust openings.

Figure 11:
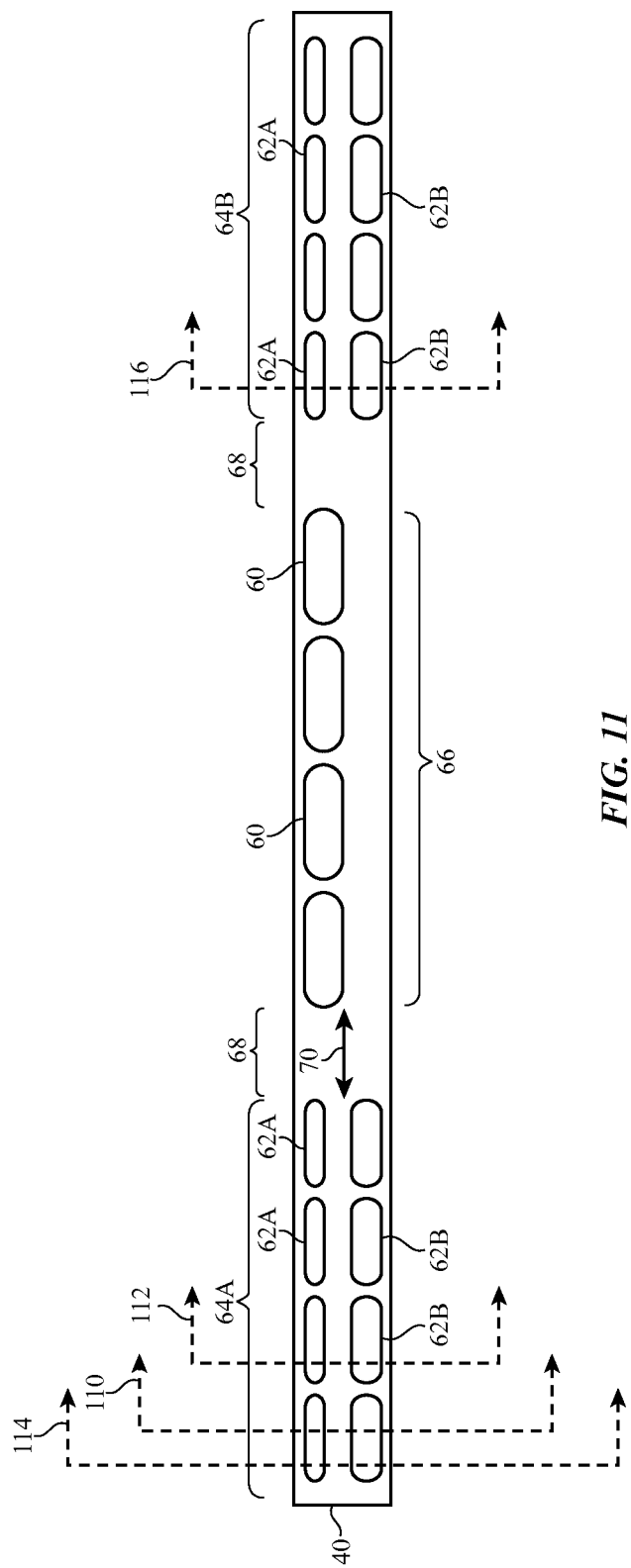
FIG. 11 is a side view of an illustrative ventilation structure with intake openings and upper and lower exhaust openings in accordance with an embodiment.

FIG. 11 shows an illustrative ventilation structure with both upper and lower exhaust openings. As shown, exhaust openings 62A and 62B may be formed on the sides 64 of ventilation structure 40. Intake openings 60 may be formed in central portion 66 of ventilation structure 40. The intake openings and the exhaust openings may be separated by portions of ventilation structures without openings (e.g., portions 68). These portions may be included to ensure that the heated exhaust air is not recirculated into lower housing 12B through intake openings 62. Portions 68 may have a width 70 that defines the distance between the intake openings and the exhaust openings. Width 70 may be any desired distance. For example, the intake openings and exhaust openings may be separated by one or more millimeters, one or more centimeters, three or more centimeters, or any other desired distance.

Exhaust openings 62B may be positioned on a lower portion of ventilation structure 40. This ensures that the air that exits the lower housing 12B travels through exhaust openings 62B to behind the lower housing and the upper housing of device 10. To ensure adequate ventilation at large lid angles, ventilation structure 40 may include exhaust openings 62A on an upper portion of ventilation structure 40. Exhaust openings 62A may allow a portion of the exhaust air to be expelled out the top of the lower housing in front of the upper housing.

Exhaust openings 62A and 62B may be the same size or different sizes. In certain scenarios, it may be advantageous for the upper exhaust openings 62A to be smaller than the lower exhaust openings 62B. Lower exhaust openings 62B may be larger than upper exhaust openings 62A to allow the majority of exhaust air to exit lower housing 12B through the lower exhaust openings. This ensures improved spatial separation of the hot exhaust air and cool intake air. Additionally, exhausting only a small portion of air through the top of lower housing 12B ensures that the display in upper housing 12B is not overheated.

Ventilation structure 40 of FIG. 11 may be implemented in electronic device 10 such that the angle of upper housing 12A relative to lower housing 12B changes the ventilation system of the device. For example, ventilation structure 40 may be arranged such that upper exhaust openings 62A are blocked when the portable computer is closed. When the portable computer is closed, lower exhaust openings 62B offer sufficient ventilation to control the temperature of lower housing 12B. Therefore, when the portable computer is closed substantially all (e.g., 95% or more) of the exhaust air may exit lower housing 12B through the lower exhaust openings. However, as discussed in connection with FIG. 3, using only lower exhaust openings 62B may be insufficient when upper housing 12A is at a large angle relative to lower housing 12B. Therefore, upper exhaust openings 62A may not be blocked when the lid of the portable computer is open. This allows exhaust air to be expelled through both openings 62A and 62B at large angles, ensuring adequate ventilation of lower housing 12B at all lid angles.

Air may be exhausted through upper exhaust openings 62A at a first rate when the portable computer is closed and a second rate that is greater than the first rate when the portable computer is open. Similarly, air may be exhausted through lower exhaust openings 62B at a first rate when the portable computer is closed and a second rate that is less than the first rate when the portable computer is open.

Figure 12:
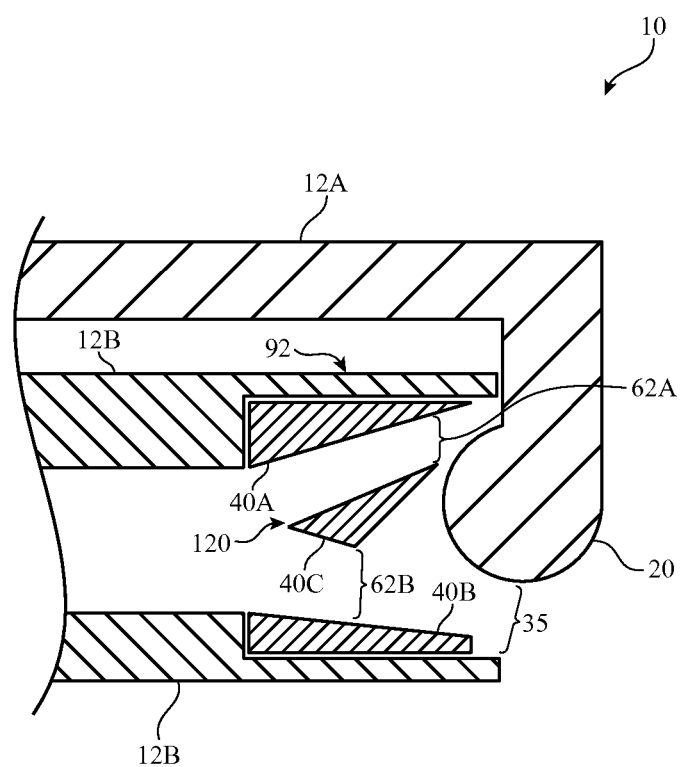
FIG. 12 is a cross-sectional side view of an illustrative exhaust portion of the ventilation structure of FIG. 11 in a closed laptop computer in accordance with an embodiment.
Figure 13:
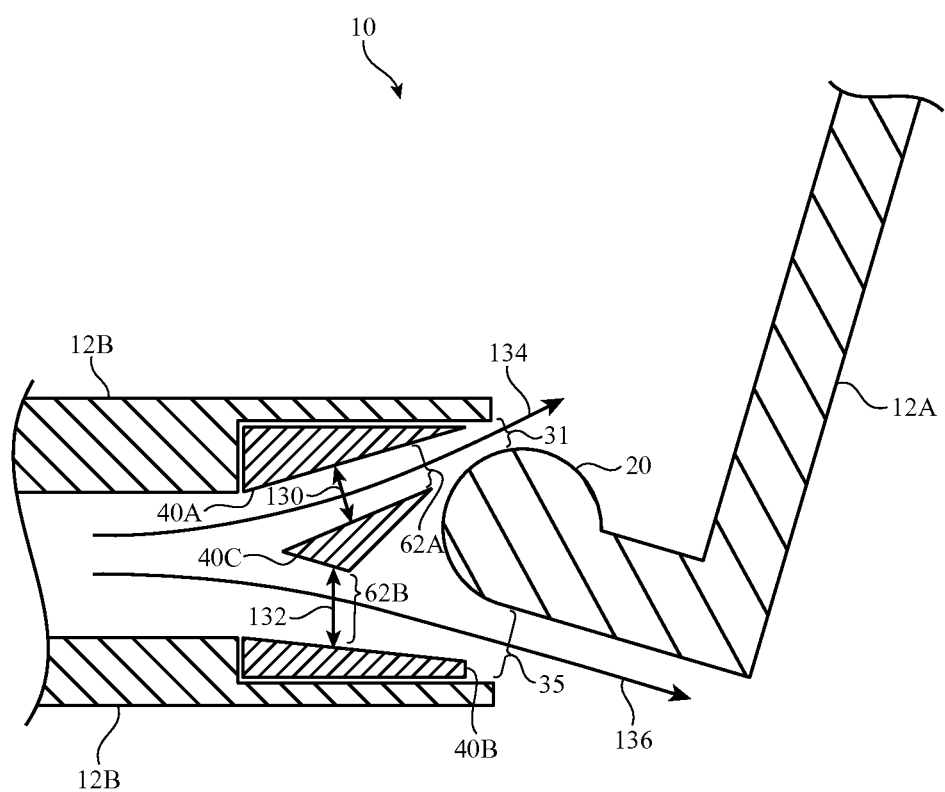
FIG. 13 is a cross-sectional side view of an illustrative exhaust portion of the ventilation structure of FIG. 11 in an open laptop computer in accordance with an embodiment.

FIGS. 12 and 13 are cross-sectional side views of an illustrative ventilation structure taken along line 110 of FIG. 11. FIG. 12 shows ventilation structure 40 in a portable computer with the lid closed while FIG. 13 shows ventilation structure 40 in a portable computer with the lid open. As shown in FIG. 12, upper exhaust openings 62A may be formed by top portion 40A of ventilation structure 40 and middle portion 40C of ventilation structure 40. Lower exhaust openings 62B may be formed by lower portion 40B of ventilation structure 40 and middle portion 40C of ventilation structure 40. The central portion 40C of ventilation structure 40 may have a leading vertex 120. Exhaust air from the lower housing may be split by vertex 120 of dividing portion 40C. The positioning and angle of vertex 120 may determine what portion of the exhaust air will exit lower housing 12B through the lower exhaust openings 62B and what portion of the exhaust air will exit lower housing 12B through the upper exhaust openings 62A.

As shown in FIG. 12, lower housing 12B and upper housing 12A may combine to block upper exhaust openings 62A when the portable computer is closed. Portion 92 of lower housing 12B may be adjacent to upper housing 12A when the portable computer is closed. This ensures that substantially all of the exhaust air exits through lower exhaust openings 62B when the portable computer is closed. Lower housing 12B may be separated from upper housing 12A by less than 2 millimeters, less than 1 millimeter, less than 0.5 millimeters, less than 0.1 millimeters, or approximately 0 millimeters when the portable computer is closed. In certain embodiments, top portion 40A of ventilation structure 40 may be adjacent to upper housing 12A when the portable computer is closed. In general, any design that ensures upper exhaust openings 62A are blocked when the device is closed may be used.

When the portable computer is open, as shown in FIG. 13, upper exhaust openings 62A may be used to expel a portion of the hot exhaust air from lower housing 12B. Opening the portable computer separates portion 92 of lower housing 12B from upper housing 12A. As a result, upper exhaust openings 62A are no longer blocked. Upper exhaust openings 62A may be aligned with upper gap 31 while lower exhaust openings 62B may be aligned with lower gap 35. A portion of the exhaust air may thus follow path 134 and be expelled through upper gap 31 and upper exhaust openings 62A, while a portion of the exhaust air may follow path 136 and be expelled through lower gap 35 and lower exhaust openings 62B.

Upper exhaust openings 62A may be used to expel any desired percentage of the exhaust air. For example, upper exhaust openings 62A may be used to expel less than 10% of the exhaust air while lower exhaust openings 62B may be used to expel more than 90% of the exhaust air, upper exhaust openings 62A may be used to expel less than 20% of the exhaust air while lower exhaust openings 62B may be used to expel more than 80% of the exhaust air, upper exhaust openings 62A may be used to expel less than 40% of the exhaust air while lower exhaust openings 62B may be used to expel more than 60% of the exhaust air, or upper exhaust openings 62A may be used to expel 40% or more of the exhaust air while lower exhaust openings 62B may be used to expel 60% or less of the exhaust air.

The ventilation port structure may be configured to direct a larger amount of airflow through lower exhaust openings 62B when the lid is in the closed position than when the lid is in the open position. The ventilation port structure may be configured to direct a smaller amount of airflow through upper exhaust openings 62B when the lid is in the closed position than when the lid is in the open position.

Figure 14:
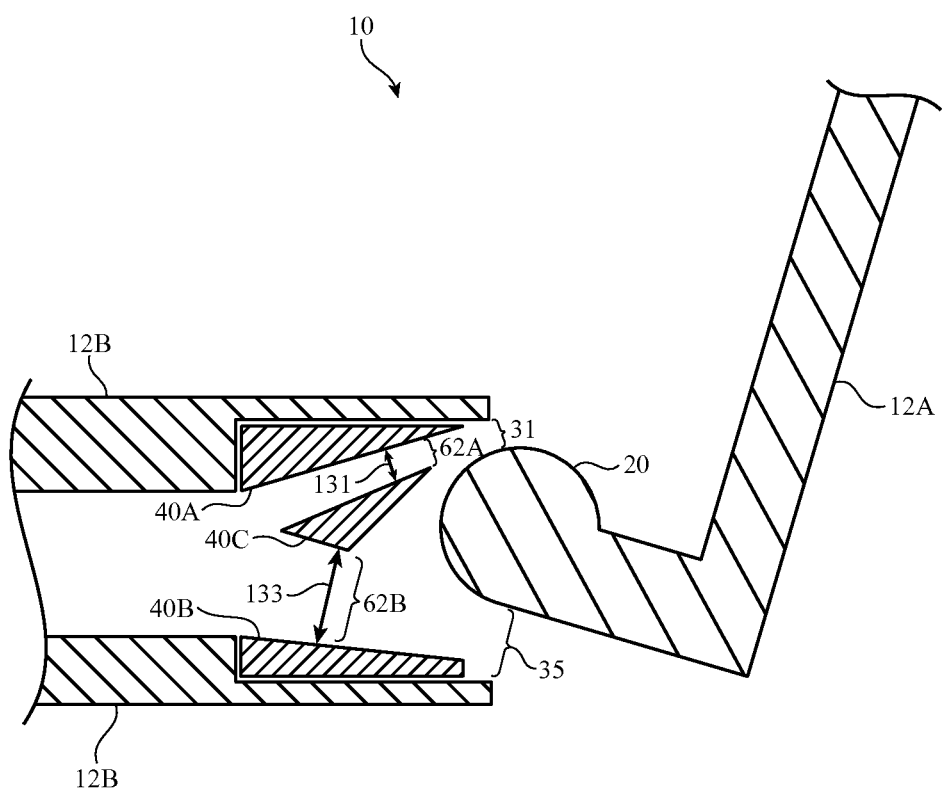
FIG. 14 is a cross-sectional side view of an illustrative exhaust portion of the ventilation structure of FIG. 11 in an open laptop computer in accordance with an embodiment.

FIG. 14 is a cross-sectional side view of an illustrative electronic device with ventilation structure 40 of FIG. 11. FIG. 14 shows that the shape of central portion 40C of ventilation structure 40 may be adjusted to finely tune the temperature profile of the electronic device. For example, FIG. 13 shows top portion 40A separated from middle portion 40C by a distance 130, while lower portion 40B is separated from middle portion 40C by a distance 132.

FIG. 14 shows top portion 40A separated from middle portion 40C by a distance 131, while lower portion 40B is separated from middle portion 40C by a distance 133. Distance 131 in FIG. 14 may be smaller than distance 130 in FIG. 13, while distance 133 in FIG. 14 may be larger than distance 132 in FIG. 13. As a result, the ventilation opening of FIG. 14 may distribute a larger percentage of air to lower exhaust opening 62B than the ventilation structure of FIG. 13. For example, the ventilation structure in FIG. 13 may expel 30% of exhaust air through upper exhaust opening 62A and 70% of exhaust air through lower exhaust opening 62B, while the ventilation structure in FIG. 14 may expel 20% of exhaust air through upper exhaust opening 62A and 80% of exhaust air through lower exhaust opening 62B.

In certain embodiments, the shape of middle portion 40C may be uniform across the portions of ventilation structure 40 with lower and upper exhaust openings. For example, a cross-sectional side view of ventilation structure 40 in FIG. 11 may be the same regardless of whether the cross-sectional side view was taken along line 110, 112, 114, or 116. In other embodiments, each edge may have a different but uniform cross-section. For example, edge 64A (e.g., cross-sections taken along lines 110, 112, or 114) may have the cross-sectional side view shown in FIG. 13 while edge 64B (e.g., the cross-section taken along line 116) may have the cross-sectional side view shown in FIG. 14. In yet another embodiment, each set of openings may have a uniform but unique cross-section. For example, cross-sections taken along lines 110 and 114 in FIG. 11 may be associated with the cross-sectional side view of FIG. 13, while the cross-section taken along line 112 may be associated with the cross-sectional side view of FIG. 14. Finally, the ventilation structure may have a varying cross-section in a single set of openings. For example, the cross-section taken along line 110 in FIG. 11 may be associated with the cross-sectional side view of FIG. 13 while the cross-section taken along line 114 in FIG. 11 may be associated with the cross-sectional side view of FIG. 14.

Ventilation structure 40 may be designed according to the specific application of the ventilation structure. In certain portable computers, there may be electronic components that are more heat sensitive in certain locations and electronic components that are less heat sensitive in certain locations. The ventilation structure may be designed to expel more heat through the upper exhaust openings in the areas with less heat sensitive components. The ventilation structure may expel less heat through the upper exhaust openings in the areas with more heat sensitive components to ensure the heat sensitive components function properly during use. In another scenario, it may be desirable to keep temperature uniform in certain areas. One illustrative example is areas in the portable electronic device with antenna traces. Antenna traces may be sensitive to irregularities in temperature, meaning that optimally the antenna traces should all be one uniform temperature. The ventilation structure may be designed to vary the amount of heat expelled through the upper exhaust openings to ensure that nearby antenna traces maintain a uniform temperature.

Figure 15:
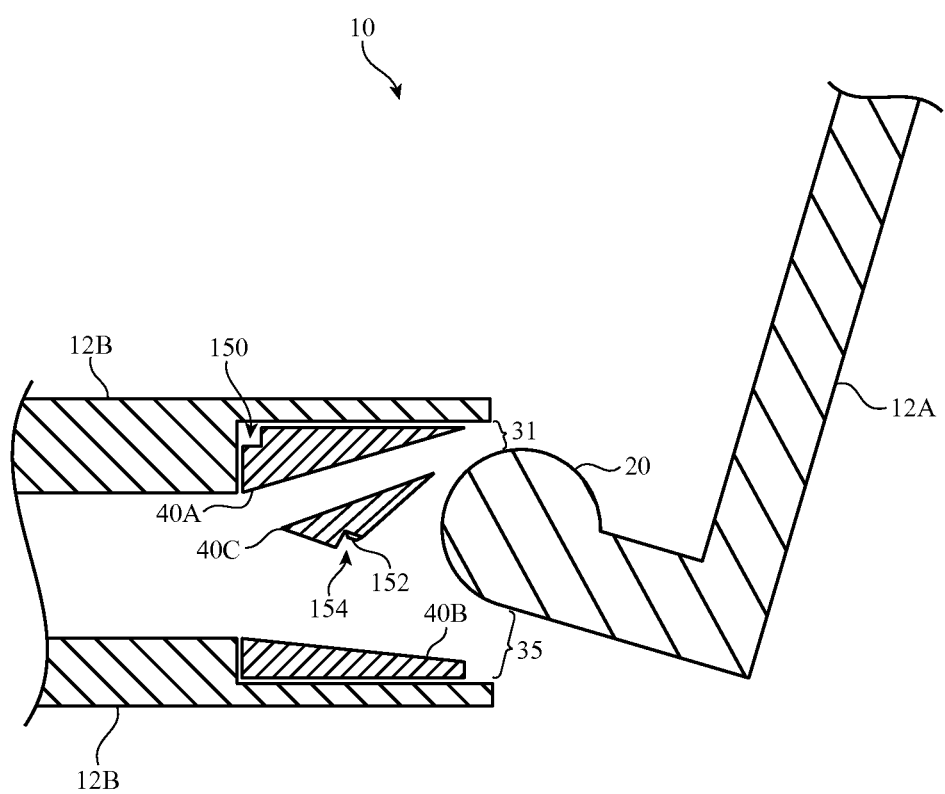
FIG. 15 is a cross-sectional side view of an illustrative exhaust portion of the ventilation structure of FIG. 11 that has recesses for additional electronic components in accordance with an embodiment.

FIG. 15 is a cross-sectional side view of an electronic device with a ventilation structure. As shown in FIG. 15, ventilation structure 40 may have a top portion 40A, a middle portion 40C, and a bottom portion 40B. Top portion 40A may have a recess 150. Recess 150 may be used to accommodate cables or other electronic components. Similarly, middle portion 40C of ventilation structure 40 may have a recess 154. Recess 154 may provide a surface 152 which can act as a substrate for additional components. For example, antenna traces may be included on surface 152. This example is merely illustrative. In general, any surface in ventilation structure 40 may act as a substrate for any desired electronic components.

Figure 16:
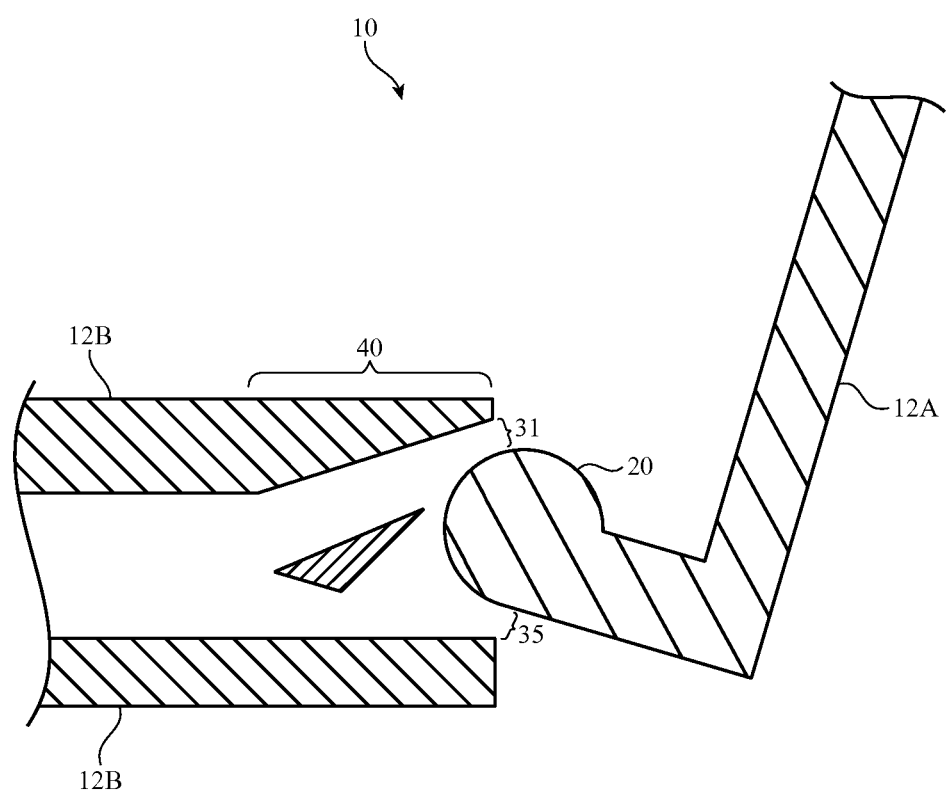
FIG. 16 is a cross-sectional side view of an illustrative lower housing with an integrally formed ventilation portion in accordance with an embodiment.

FIG. 16 is a cross-sectional side view of an illustrative lower housing with an integrally formed ventilation portion. As shown, some or all of ventilation housing portion 40 may be formed integrally with lower housing 12B. In this embodiment, lower housing 12B and the ventilation housing portion 40 may be formed from the same material (e.g., plastic or metal). Lower housing 12B may be a unitary piece or may include multiple portions that are attached together. If desired, only some of the ventilation housing portion may be formed integrally with lower housing 12B. For example, top and bottom portions 40A and 40B in FIG. 12 may be formed integrally with lower housing 12B while middle portion 40C may be a separate structure that is attached to lower housing 12B.

The foregoing is merely illustrative of the principles of this invention and various modifications can be made by those skilled in the art without departing from the scope and spirit of the invention.

What is claimed is:

1. An electronic device comprising:
    an upper housing that contains a display;
    a lower housing that contains a keyboard;
    a fan in the lower housing;
    hinge structures that connect the upper housing to the lower housing so that the upper housing rotates relative to the lower housing about a rotational axis between a closed position and an open position, wherein there is a lower gap between the upper housing and the lower housing that runs parallel to the rotational axis, when the upper housing is in the closed position the fan blows air through the lower gap, and when the upper housing is in the open position the fan blows air through the lower gap and an upper gap between the upper housing and the lower housing that runs parallel to the rotational axis; and
    a ventilation port structure in the lower housing that extends parallel to the rotational axis, wherein the ventilation port structure comprises first, second, and third portions extending in series parallel to the rotational axis, each of the first, second, and third portions includes a plurality of slots, the fan draws air into the lower housing through the slots of the second portion while exhausting air from the lower housing through the slots of the first and third portions, and the slots in the first and third portions include a first set of slots that are aligned with the upper gap and a second set of slots that are aligned with the lower gap.

2. The electronic device defined in claim 1, wherein the slots in the second portion are aligned with the upper gap and the fan draws air into the lower housing through the slots in the second portion and the upper gap.

3. The electronic device defined in claim 2, wherein when the upper housing is in the open position the fan blows air through the first set of slots and the upper gap.

4. The electronic device defined in claim 1, wherein when the upper housing is in the closed position the fan blows air through the lower gap at a first rate and when the upper housing is in the open position the fan blows air through the lower gap at a second rate that is lower than the first rate.

5. The electronic device defined in claim 1, wherein when the upper housing is in the closed position a first percentage of the air blown by the fan passes through the lower gap when the upper housing is in the closed position a second percentage of the air blown by the fan passes through the lower gap, and the second percentage is lower than the first percentage.

6. The electronic device defined in claim 1, wherein the lower housing comprises metal and the upper housing comprises metal.

7. The electronic device defined in claim 1, wherein the upper housing is parallel to the lower housing in the closed position and the upper housing is at an angle between 90° and 135° relative to the lower housing in the open position.

8. A ventilation system for an electronic device that has a lid and a base, wherein the lid rotates about a rotational axis with respect to the base between an open position and a closed position, the ventilation system comprising:
    a ventilation port structure that extends along an edge of the base, wherein the ventilation port structure has at least first and second rows of openings that extend parallel to the rotational axis; and
    at least one fan that exhausts air from within the base through the first and second rows of openings, wherein when the lid is in the open position a portion of the lid divides the exhausted air into first and second portions, the first portion of the exhausted air flows to one side of the lid through the first row of openings, the second portion of the exhausted air flows to an opposing side of the lid through the second row of openings, the ventilation port structure is configured to direct a larger amount of airflow through the second row of openings when the lid is in the closed position than when the lid is in the open position, and the ventilation port structure is configured to direct a smaller amount of airflow through the first row of openings when the lid is in the closed position than when the lid is in the open position.

9. The ventilation system defined in claim 8, further comprising a cable mounted in a recess in the ventilation port structure.

10. The ventilation system defined in claim 8, further comprising an antenna element on the ventilation port structure.

11. The ventilation system defined in claim 10 wherein a portion of the ventilation port structure is located between the first and second rows of openings and the antenna element is supported by the portion of the ventilation port structure.

12. An apparatus comprising:
a lower electronic device housing;
an upper electronic device housing, wherein the upper electronic device housing rotates about a rotational axis with respect to the lower electronic device housing between an open position and a closed position and when the upper electronic device housing is in the open position there is a lower gap between the upper electronic device housing and the lower electronic device housing that runs parallel to the rotational axis and an upper gap between the upper electronic device housing and the lower electronic device housing that runs parallel to the rotational axis; and
a ventilation port structure that extends along an edge of the lower electronic device housing, wherein the ventilation port structure has an intake port and an exhaust port, the exhaust port comprises a first opening that is aligned with the lower gap and a second opening that is aligned with the upper gap, and the ventilation port structure comprises a portion that is interposed between the first opening and the second opening.

13. The apparatus defined in claim 12, wherein the intake port comprises a plurality of slots that are aligned with the upper gap.

14. The apparatus defined in claim 12, further comprising:
at least one fan that exhausts air from within the lower electronic device housing through the exhaust port, wherein when the upper electronic device housing is in the closed position the upper electronic device housing blocks the second opening and prevents the fan from exhausting air through the second opening.

15. The apparatus defined in claim 12, wherein the upper electronic device housing is parallel to the lower electronic device housing in the closed position and the upper electronic device housing is at an angle between 90° and 135° relative to the lower electronic device housing in the open position.

16. The apparatus defined in claim 12, wherein the portion of the ventilation structure is a middle portion of the ventilation structure, the ventilation structure comprises a top portion, and the top portion and the middle portion of the ventilation structure define the second opening.

17. The apparatus defined in claim 16, wherein the ventilation structure comprises a bottom portion and the bottom portion and the middle portion of the ventilation structure define the first opening.

18. The apparatus defined in claim 17, further comprising:
at least one fan that exhausts air from within the lower electronic device housing through the exhaust port, wherein the middle portion of the ventilation structure has a leading vertex that splits the air into a first portion that is exhausted from within the lower electronic device housing through the first opening and a second portion that is exhausted from within the lower electronic device housing through the second opening.

19. The electronic device defined in claim 1, wherein a portion of the ventilation port structure is interposed between the first set of slots and the second set of slots.

20. The electronic device defined in claim 1, wherein the first set of slots are aligned with only the upper gap and wherein the second set of slots are aligned with only the lower gap.

* * * * *